US008110853B2

(12) United States Patent
Voldman (10) Patent No.: US 8,110,853 B2
(45) Date of Patent: Feb. 7, 2012

(54) GUARD RING STRUCTURES FOR HIGH VOLTAGE CMOS/LOW VOLTAGE CMOS TECHNOLOGY USING LDMOS (LATERAL DOUBLE-DIFFUSED METAL OXIDE SEMICONDUCTOR) DEVICE FABRICATION

(75) Inventor: Steven Howard Voldman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 12/475,661

(22) Filed: Jun. 1, 2009

(65) Prior Publication Data

US 2009/0236662 A1    Sep. 24, 2009

Related U.S. Application Data

(62) Division of application No. 11/778,414, filed on Jul. 16, 2007, now Pat. No. 7,541,247.

(51) Int. Cl.
*H01L 27/085* (2006.01)
(52) U.S. Cl. ........ 257/170; 257/409; 257/494; 257/495; 257/E29.013
(58) Field of Classification Search .................. 257/170, 257/409, 494, 495, E29.013
See application file for complete search history.

(56) References Cited

U.S. PATENT DOCUMENTS

| 3,798,512 | A | * | 3/1974 | Critchlow et al. | 257/400 |
|---|---|---|---|---|---|
| 3,888,706 | A | * | 6/1975 | Dingwall | 438/220 |
| 5,023,689 | A | * | 6/1991 | Sugawara | 257/372 |
| 5,028,548 | A | | 7/1991 | Nguyen | |
| 5,438,005 | A | * | 8/1995 | Jang | 438/220 |
| 6,169,309 | B1 | | 1/2001 | Teggatz et al. | |
| 6,395,593 | B1 | | 5/2002 | Pendharkar et al. | |
| 6,459,134 | B2 | | 10/2002 | Ohguro et al. | |
| 6,583,486 | B2 | | 6/2003 | Kim | |
| 6,729,886 | B2 | | 5/2004 | Efland et al. | |
| 6,747,294 | B1 | | 6/2004 | Gupta et al. | |
| 6,784,493 | B2 | | 8/2004 | Efland et al. | |
| 6,833,586 | B2 | | 12/2004 | Tsuchiko | |
| 6,924,531 | B2 | | 8/2005 | Chen et al. | |
| 6,933,559 | B1 | | 8/2005 | Van Roijen et al. | |
| 7,129,559 | B2 | | 10/2006 | Wu et al. | |

(Continued)

FOREIGN PATENT DOCUMENTS

JP    8306937 A    11/1996

OTHER PUBLICATIONS

Notice of Allowance (Mail Date Feb. 5, 2009) for U.S. Appl. No. 11/778,414, filed Jul. 16, 2007.

*Primary Examiner* — George Fourson, III
(74) *Attorney, Agent, or Firm* — Schmeiser, Olsen & Watts; Anthony J. Canale (57) ABSTRACT

A semiconductor structure. The semiconductor structure includes a semiconductor substrate, a first transistor on the semiconductor substrate, and a guard ring on the semiconductor substrate. The semiconductor substrate includes a top substrate surface which defines a reference direction perpendicular to the top substrate surface. The guard ring includes a semiconductor material doped with a doping polarity. A first doping profile of a first doped transistor region of the first transistor in the reference direction and a second doping profile of a first doped guard-ring region of the guard ring in the reference direction are essentially a same doping profile. The guard ring forms a closed loop around the first transistor.

12 Claims, 8 Drawing Sheets

U.S. PATENT DOCUMENTS

| | | |
|---|---|---|
| 7,135,138 B2 | 11/2006 | Puniello et al. |
| 7,141,860 B2 | 11/2006 | Khemka et al. |
| 7,285,453 B2 | 10/2007 | Liou |
| 7,304,356 B2 * | 12/2007 | Takahashi .................... 257/401 |
| 7,420,255 B2 * | 9/2008 | Shimizu ....................... 257/409 |
| 7,655,980 B1 * | 2/2010 | Chao et al. .................... 257/335 |
| 2001/0028096 A1 | 10/2001 | Ohguro et al. |
| 2003/0025154 A1 | 2/2003 | Haynie |
| 2005/0073007 A1 | 4/2005 | Chen et al. |
| 2006/0027874 A1 | 2/2006 | Tsai et al. |
| 2006/0060934 A1 | 3/2006 | Lien et al. |
| 2006/0145185 A1 | 7/2006 | Mallikarjunaswamy |
| 2006/0226499 A1 | 10/2006 | Shimizu |
| 2006/0270171 A1 | 11/2006 | Chen et al. |
| 2006/0278924 A1 | 12/2006 | Kao |
| 2007/0132008 A1 | 6/2007 | Kang et al. |
| 2007/0272979 A1 | 11/2007 | Saito et al. |
| 2007/0281406 A1 | 12/2007 | Chen |
| 2008/0006899 A1 | 1/2008 | Kim et al. |
| 2008/0132028 A1 | 6/2008 | Lien et al. |

* cited by examiner

GUARD RING STRUCTURES FOR HIGH VOLTAGE CMOS/LOW VOLTAGE CMOS TECHNOLOGY USING LDMOS (LATERAL DOUBLE-DIFFUSED METAL OXIDE SEMICONDUCTOR) DEVICE FABRICATION

This application is a divisional application claiming priority to Ser. No. 11/778,414, filed Jul. 16, 2007, now U.S. Pat. No. 7,541,247, issued Jun. 2, 2009.

FIELD OF THE INVENTION

The present invention relates generally to guard ring structures and more particularly to guard ring structures in smart power technology using LDMOS (lateral double-diffused metal oxide semiconductor) device fabrication.

BACKGROUND OF THE INVENTION

Today, in smart power technology, high voltage CMOS (HVCMOS) and low voltage CMOS (LVCMOS) exist on a common wafer. Low voltage CMOS technology operates in the 1V to 5V power levels. HVCMOS technology operates between 20V to 120V power levels.

In high voltage CMOS (HVCMOS) technology, a concern is the interaction between the LDMOS transistors and the adjacent low voltage CMOS circuitry. In HVCMOS, inductive "load dumps" initiate injection of carriers into the chip substrate. As a result of the physical size of the HVCMOS and LDMOS devices, as well as the magnitude of the current injection, it is critical not to disturb the other chip functions on the smart power chips.

In addition, CMOS latchup is a growing issue in the smart power applications due to the harsh requirements of the automobile industry. CMOS latchup can occur from overshoot and undershoot phenomena. Other sources of issues for CMOS latchup include cable discharge events (CDE), transient oscillation events, and signal mis-match which can lead to injection of carriers into the substrate wafer.

Therefore, there is a need in smart power applications to isolate 120V operation from 45V operation, 120V operation from 5V operation, 120V operation from sub-5V operation, as well as 45V operation from 5V and sub-5V operation. Therefore, there is a need for a structure (and a method for forming the same) which electrically isolate each device from its neighbouring devices, where the neighbouring devices are at a different voltage level.

Today, system-on-chip (SOC) applications are also in the low voltage sector mixed signal (voltage) and radio frequency (RF) requirements. System-on-chip (SOC) applications has a wide range of power supply conditions, number of independent power domains, and circuit performance objectives. Different power domains are established between digital, analog and radio frequency (RF) functional blocks on an integrated chip. The integration of different circuits and system functions into a common chip has also resulted in solutions for ensuring that noise from one portion or circuit of the chip does not affect a different circuit within the chip. With the chip integration issues, the need for better guard rings and alternative guard ring solutions have had increased interest.

SUMMARY OF THE INVENTION

The present invention provides a semiconductor structure, comprising (a) a semiconductor substrate which includes a top substrate surface which defines a reference direction perpendicular to the top substrate surface; (b) a first transistor on the semiconductor substrate; and (c) a guard ring on the semiconductor substrate, wherein the guard ring comprises a semiconductor material doped with a doping polarity, wherein a first doping profile of a first doped transistor region of the first transistor in the reference direction and a second doping profile of a first doped guard-ring region of the guard ring in the reference direction are essentially the same, and wherein the guard ring forms a closed loop around the first transistor.

The present invention provides a structure (and a method for forming the same) which electrically isolates each device from its neighbouring devices that are contained on the same wafer substrate.

The present invention provides a structure (and a method for forming the same) which electrically isolates power domains from its neighbouring power domains where the power domains that are contained on the same wafer substrate.

The present invention provides a structure (and a method for forming the same) which electrically isolates chip functions from neighbouring chip functions that are contained on the same wafer substrate.

The present invention addresses guard rings that are required between the high voltage CMOS power domain and low voltage power domain, and more specifically 120V from 45V operation, 120V from 5V operation, 120V to sub-5V operation, as well as 45V to 5V and sub-5V operation that are contained on the same wafer substrate.

DETAILED DESCRIPTION OF THE INVENTION

FIGS. 1A-1G' show cross-section views used to illustrate a fabrication process of a semiconductor structure 100, in accordance with embodiments of the present invention. More specifically, with reference to FIG. 1A, the fabrication process of the semiconductor structure 100 starts with a P– substrate 110. The P– substrate 110 comprises silicon doped with p-type dopants (e.g., boron atoms). The P– substrate 110 can be formed by ion implanting p-type dopants into the semiconductor substrate 110 resulting in the P– substrate 110.

Figure 1A:
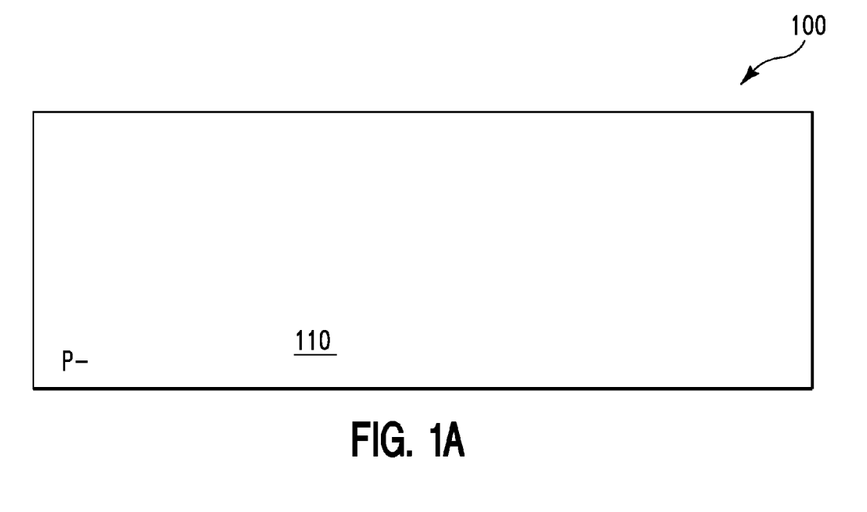
FIGS. 1A-1G' show cross-section views used to illustrate a fabrication process of a first semiconductor structure, in accordance with embodiments of the present invention.
Figure 1B:
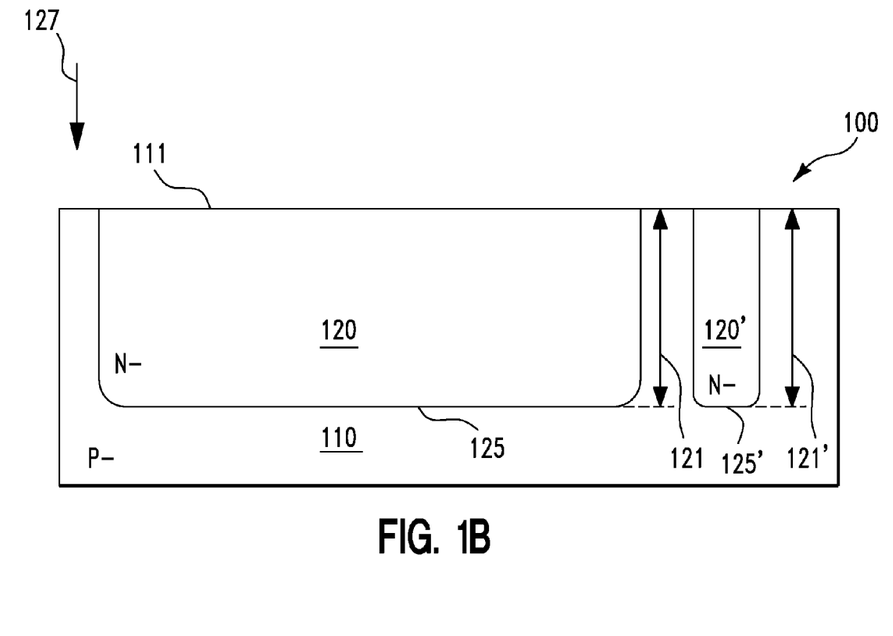

Next, with reference to FIG. 1B, in one embodiment, an N– region 120 and an N– region 120' are formed in the P– substrate 110. The N– regions 120 and 120' can be formed by (i) forming a photoresist layer (not shown) on top of the structure 100 of FIG. 1A, (ii) patterning the photoresist layer, and (iii) ion implanting n-type dopants into the P– substrate 110 with the patterned photoresist layer as a blocking mask resulting in the N– regions 120 and 120'. Then, the patterned photoresist layer is removed resulting in the structure 100 of FIG. 1B.

As a result of the N– region 120 and the N– region 120' being formed by the same ion implantation process, a depth 121 of the N– region 120 and a depth 121' of the N– region 120' are equal. The depth 121 of the N– region 120 is the vertical distance from the top surface 111 of the substrate 110 to the bottom surface 125 of the N− region 120. The depth 121' of the N− region 120' is a vertical distance from the top surface 111 of the substrate 110 to the bottom surface 125' of the N− region 120'. Also as a result of the N− region 120 and the N− region 120' being formed by the same ion implantation process, doping concentrations with respect to the depth (i.e., in the reference direction 127 which is perpendicular to the top surface 111 of the substrate 110) in both the N− region 120 and the N− region 120' have the same doping profile. The doping profile of the N− region 120 is the dopant concentration of the N− region 120 distributed along the depth 121 of the N− region 120. The doping profile of the N− region120' is the dopant concentration of the N− region 120' distributed along the depth 121' of the N− region 120'.

Figure 1C:
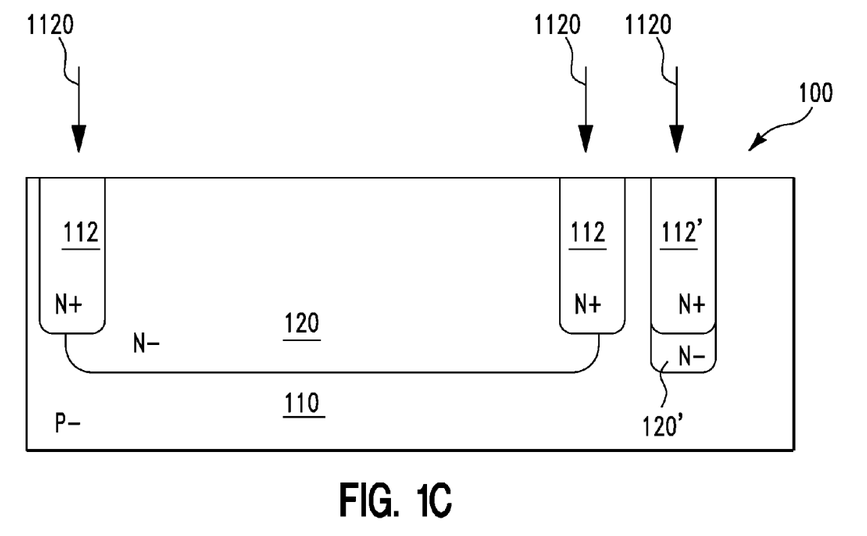

Next, with reference to FIG. 1C, in one embodiment, N+ regions 112 and an N+ region 112' are formed in the semiconductor structure 100 of FIG. 1A. The N+ regions 112 and 112' can be formed by (i) forming a photoresist layer (not shown) on top of the structure 100 of FIG. 1B, (ii) patterning the photoresist layer, and (iii) ion implanting n-type dopants by an ion implantation process into the semiconductor structure 100 with the patterned photoresist layer as a blocking mask resulting in the N+ regions 112 and 112'. The bombarding direction of the ion implantation process is represented by arrows 1120. The ion implantation process hereafter is referred to as an ion implantation process 1120. Hereafter, an ion implantation process and the arrows representing the direction of the ion bombardment of the ion implantation process have the same reference numeral for simplicity. After that, the patterned photoresist layer is removed resulting in the structure 100 of FIG. 1C. The N+ regions 112 and 112' are heavily doped such that the dopant concentration of the N+ regions 112 and 112' is higher than the dopant concentration of the N− regions 120 and 120'.

Figure 1D:
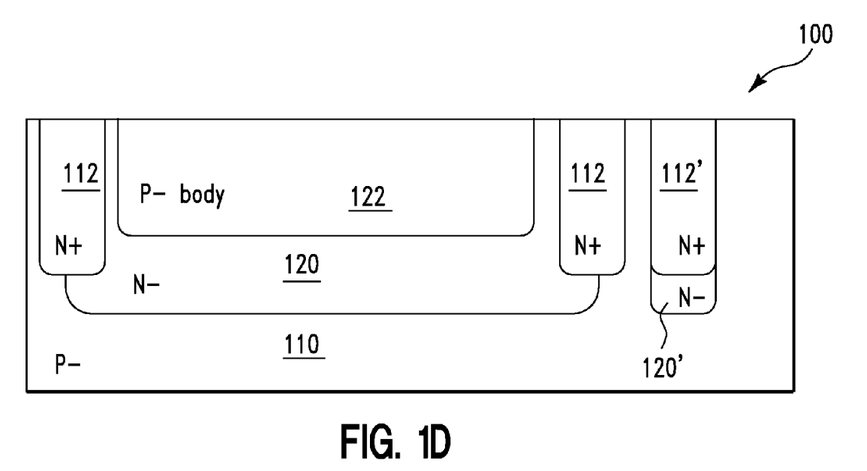

Next, with reference to FIG. 1D, in one embodiment, a P-body region 122 is formed in the N− region 120. The P− region 122 can be formed by (i) forming a photoresist layer (not shown) on top of the structure 100 of FIG. 1C, (ii) patterning the photoresist layer, and (iii) ion implanting p-type dopants into the N− region 120 with the patterned photoresist layer as a blocking mask resulting in the P− regions 122. After that, the patterned photoresist layer is removed resulting in the structure 100 of FIG. 1D.

Figure 1E:
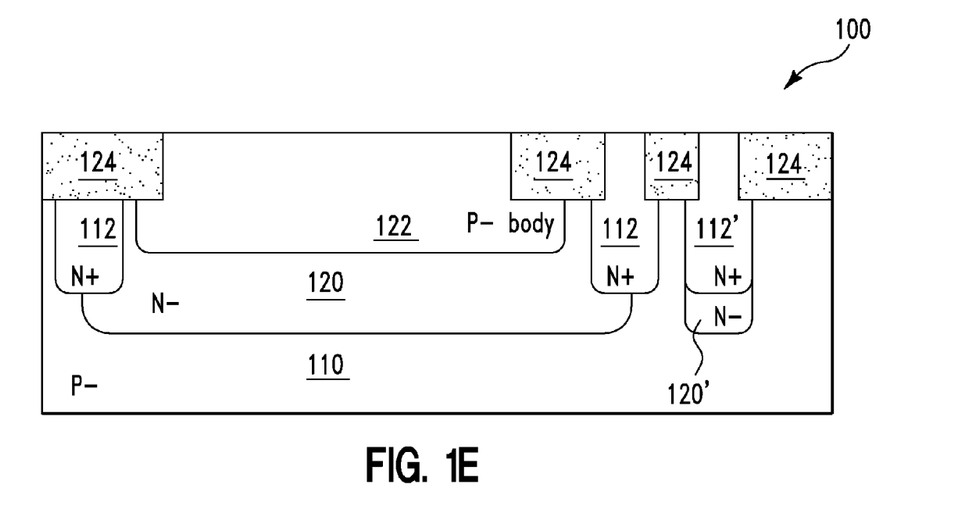

Next, with reference to FIG. 1E, in one embodiment, STI (shallow trench isolation) regions 124 are formed in the semiconductor structure 100 of FIG. 1D. The STI regions 124 can comprise silicon dioxide. The STI regions 124 can be formed by (i) forming a photoresist layer (not shown) on top of the structure 100 of FIG. 1D, (ii) patterning the photoresist layer, (iii) anisotropically etching the semiconductor structure 100 using the patterned photoresist layer as a blocking mask resulting in shallow trenches, and then (iv) filling back the shallow trenches with silicon dioxide resulting in the STI regions 124.

Figure 1F:
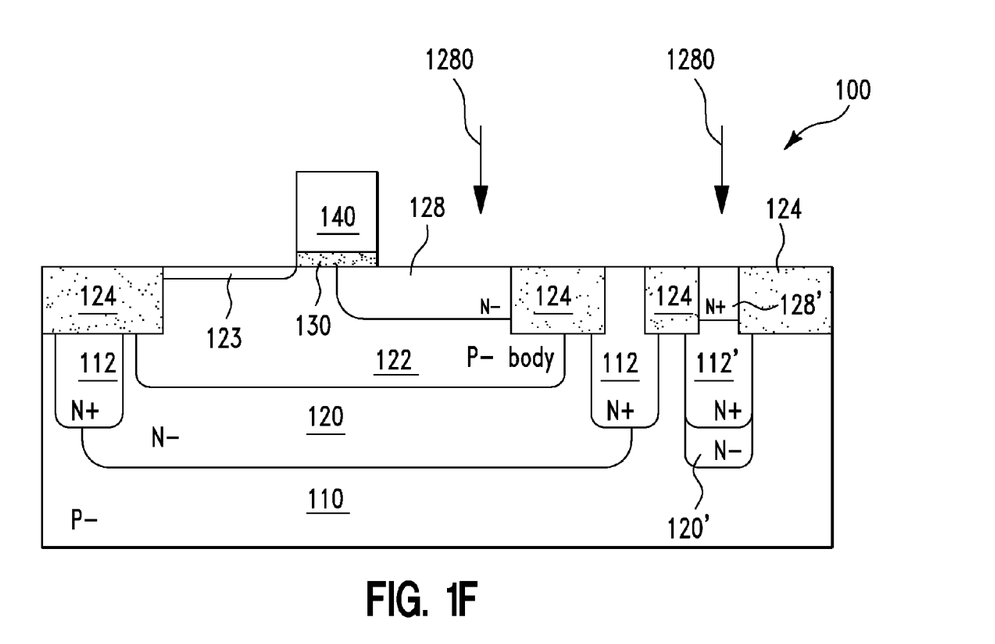

Next, with reference to FIG. 1F, in one embodiment, an N− region 128 and an N+ region 128' are formed in the P-body region 122 and the N+ region 112', respectively. The N− region 128 and the N+ region 128' can be formed in a manner similar to the manner in which the N+ regions 112 and 112' are formed in FIG. 1C. More specifically, the formation of the N− region 128 and the N+ region 128' can involve an ion implantation process 1280. It should be noted that the N+ region 128' comprises n-type dopants of the ion implantation process 1120 and further comprises n-type dopants of the ion implantation process 1280. As a result, the dopant concentration of the N+ region 128' is higher than the dopant concentration of the N− region 128.

Next, in one embodiment, a gate dielectric region 130 and a gate electrode region 140 are formed on top of the P-body region 122. The gate dielectric 130 can comprise silicon dioxide. The gate electrode region 140 can comprise polysilicon. The gate dielectric region 130 and the gate electrode region 140 can be formed by a conventional method.

Next, in one embodiment, an extension region 123 is formed in the P-body region 122. The extension region 123 comprises n-type dopants. The extension region 123 can be formed by a conventional method.

Figure 1G:
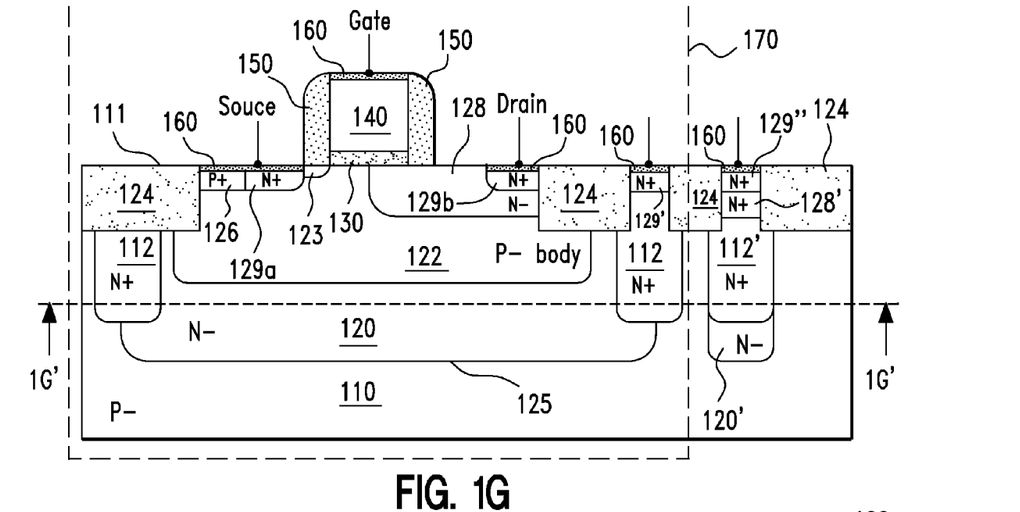

Next, with reference to FIG. 1G, in one embodiment, spacer regions 150 are formed on side walls of the gate dielectric region 130 and the gate electrode region 140. The spacer regions 150 can comprise silicon nitride. The spacer regions 150 can be formed by a conventional method.

Next, in one embodiment, a P+ region 126, an N+ region 129a, an N+ region 129b, an N+ region 129', and an N+ region 129" are formed in the semiconductor structure 100. The P+ region 126 comprises p-type dopants, whereas the N+ regions 129a, 129b, 129', and 129" comprise n-type dopants. The dopant concentration of the P+ region 126 is higher than the dopant concentrations of the P− substrate 110 and the P-body region 122. In one embodiment, the N+ regions 129a, 129b, 129', and 129" are formed simultaneously by an ion implantation process.

Next, in one embodiment, silicide regions 160 are formed on the P+ region 126, the gate electrode 140, the N+ regions 129a, 129b, 129', and 129". The silicide regions 160 can be formed by a conventional method.

Next, in one embodiment, a dielectric layer (not shown) is formed on top of the structure 100 of FIG. 1G. Next, contact regions (not shown) are formed in the dielectric layer to provide electrical access to the silicide regions 160.

It should be noted that a structure 170 of the semiconductor structure 100 of FIG. 1G is an LDMOS (Lateral double-Diffused Metal Oxide Semiconductor) transistor 170, whereas the N− region 120' and N+ regions 112', 128', and 129" constitute a guard ring 120'+112'+128'+129". In one embodiment, the guard ring 120'+112'+128'+129" is formed using steps in the fabrication process of the LDMOS transistor 170. In one embodiment, the guard ring 120'+112'+128'+129" (i) constitutes a trench in the P− substrate 110 filled with silicon doped n-type dopants and (ii) forms a closed loop around the LDMOS transistor 170. In an alternative embodiment, the guard ring 120'+112'+128'+129" forms a closed loop around a chip (integrated circuit) (i.e., is on a perimeter of the chip), wherein the chip includes the LDMOS transistor 170 and other LDMOS transistors.

This guard ring 120'+112'+128'+129" provides a structure which electrically isolates each device from its neighbouring devices that are contained on the same wafer substrate. First, this structure can be used to isolate a first LDMOS transistor from a second LDMOS transistor (e.g., isolate a p-type LDMOS from an n-type LDMOS or isolate two n-type LDMOS transistors from each other). This structure can also electrically isolate a power domain from its neighbouring power domains wherein the power domains that are contained on the same wafer substrate. This structure can also electrically isolate a chip function from neighbouring chip functions wherein all these chip functions are contained on the same wafer substrate. For example, isolating the LDMOS HVCMOS sector from the low voltage CMOS digital, analog or RF sectors. These guard rings are required between a high voltage CMOS power domain and a low voltage power domain, and more specifically, between a 120V operation and a 45V operation, between a 120V operation and a 5V operation, between a 120V operation and a sub-5V operation, as well as between a 45V operation and a 5V and sub-5V operation, wherein all these operations are contained on the same wafer substrate. These LDMOS-based guard rings can also be used within the low voltage sector between a 5V power domain and a 3.3V, 2.5V, or 1.8V power domain. Hence, the structure can be utilized within the low voltage sector of a smart power application. In addition, this structure can also be utilized around chip applications domains. For example, this can be utilized around off-chip driver (OCD) regions to avoid injection of carriers from drivers into internal core logic circuits. In addition, this structure can be used around ESD networks. These guard rings can also be used surrounding the entire chip.

It should be noted that a transistor is said to be configured to operate at a certain voltage level means that the transistor is designed such that the transistor can operate with the voltage of each and every node of the transistor varying but not exceeding the certain voltage level. For example, a transistor is said to be configured to operate at 5V means that the transistor is designed such that the transistor can operate with the voltage of each and every node of the transistor varying but not exceeding 5V.

With reference to FIG. 1G, the N− region 120 can be considered a portion of the LDMOS transistor 170. The bottom surface 125 of the N− region 120 can be considered a lowest portion of the LDMOS transistor 170. Therefore, the depth 121 (FIG. 1B) of the N− region 120 can be referred to as the depth 121 of the LDMOS transistor. Similarly, the depth 121' (FIG. 1B) of the N− region 120' can be referred to as the depth 121' of the guard ring 120'+112'+128'+129".

FIG. 1G' shows a cross-sectional zoom-out view of the semiconductor structure 100 of FIG. 1G along a line 1G'-1G', in accordance with embodiments of the present invention. More specifically, with reference to FIG. 1G', the N+ region 112' of the guard ring 120'+112'+128'+129" forms a closed loop around the N− region 120 (i.e., the guard ring 120'+112'+128'+129" forms a closed loop around the LDMOS transistor 170). It should be noted that a portion 100' of FIG. 1G' is not shown in FIG. 1G, whereas the portion 100' is shown in FIG. 1G' to show that the guard ring 120'+112'+128'+129" forms a complete closed loop.

Figure 2A:
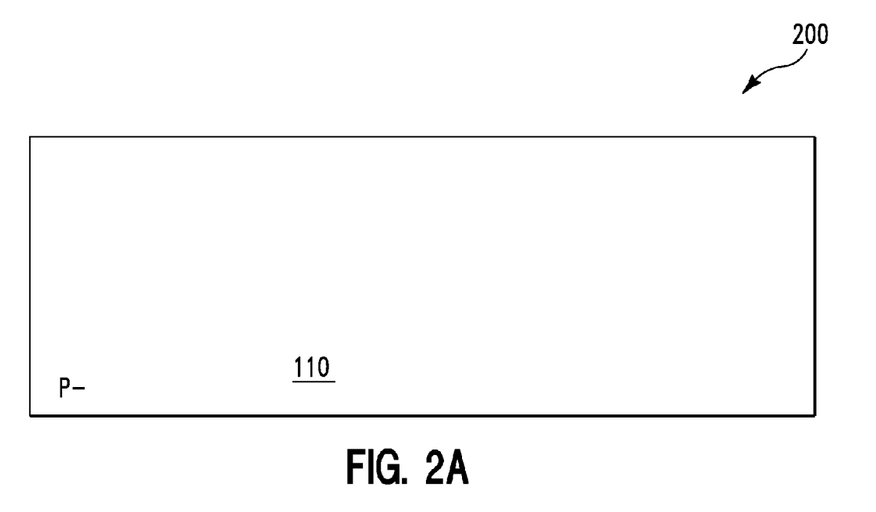
FIGS. 2A-2C show cross-section views used to illustrate a fabrication process of a second semiconductor structure, in accordance with embodiments of the present invention.
Figure 2B:
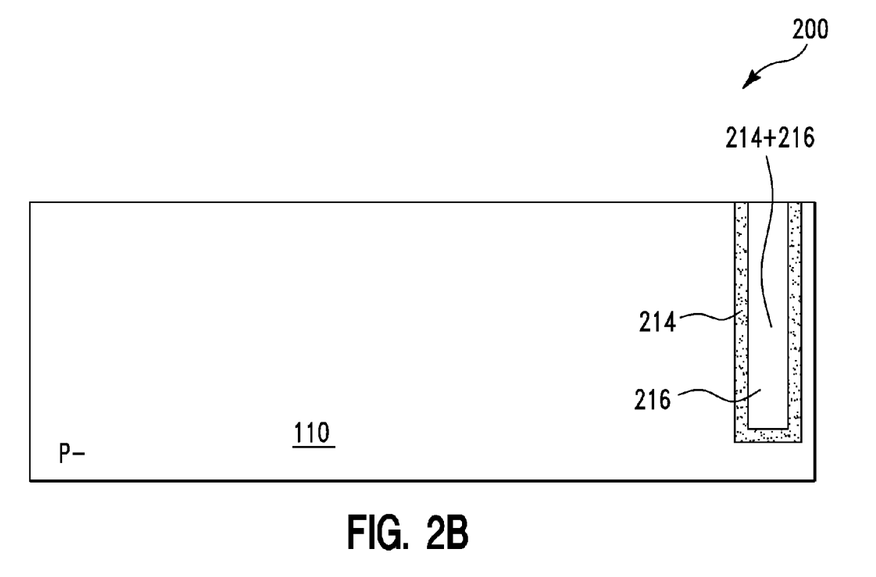
Figure 2C:
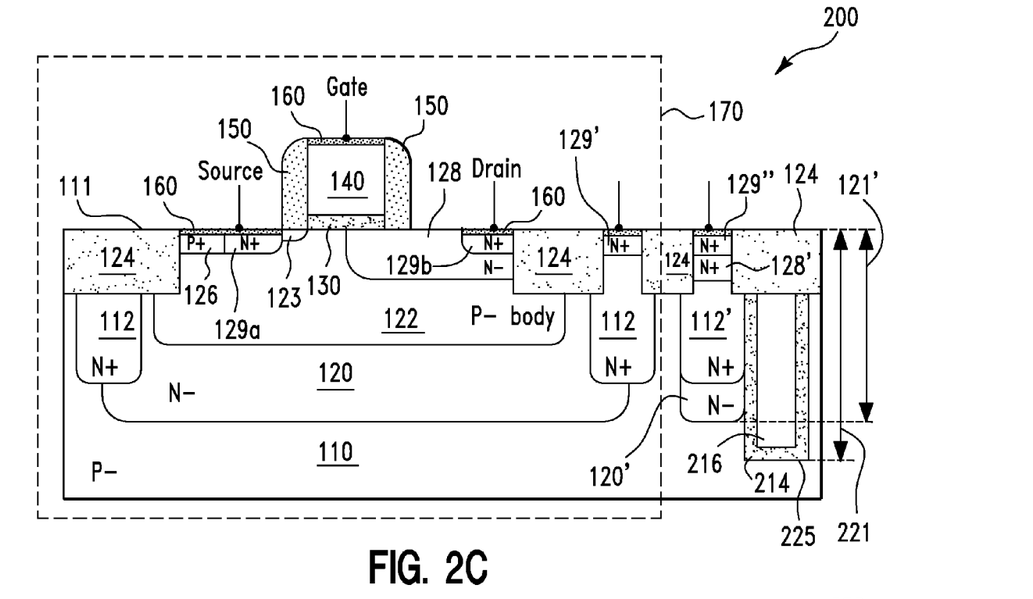

FIGS. 2A-2C show cross-section views used to illustrate a fabrication process of a semiconductor structure 200, in accordance with embodiments of the present invention. More specifically, the fabrication process of the semiconductor structure 200 starts with the semiconductor structure 200 of FIG. 2A. The structure 200 of FIG. 2A is similar to the structure 100 of FIG. 1A. The formation of the structure 200 of FIG. 2A is similar to the formation of the structure 100 of FIG. 1A.

Next, with reference to FIG. 2B, in one embodiment, a deep trench isolation region 214+216 is formed in the P− substrate 110. The deep trench isolation region 214+216 comprises a dielectric layer 214 surrounding a poly-silicon region 216. The deep trench isolation region 214+216 can be formed by a conventional method.

Next, with reference to FIG. 2C, in one embodiment, regions similar to the regions of the structure 100 of FIG. 1G are formed in the P− substrate 110 of FIG. 2B using a similar fabrication process. As a result, the structure 200 of FIG. 2C is similar to the structure 100 of FIG. 1G except that the structure 200 of FIG. 2C comprises the deep trench isolation region 214+216. In one embodiment, a depth 221 of the deep trench isolation region 214+216 is greater than the depth 121' of the N− region 120' (i.e., the depth of the guard ring 120'+ 112'+128'+129"). The depth 221 of the deep trench isolation region 214+216 is a vertical distance from the top surface 111 of the substrate 110 to the bottom surface 225 of the deep trench isolation region 214+216.

In one embodiment, the deep trench isolation region 214+ 216 forms a closed loop around the LDMOS transistor 170. In an alternative embodiment, the deep trench isolation region 214+216 forms a closed loop around a chip (i.e., is on a perimeter of the chip), wherein the chip includes the LDMOS transistor 170 and other LDMOS transistors. In one embodiment, the deep trench isolation region 214+216 can be used in manners that are similar to the above-described manners in which the guard ring 120'+112'+128'+129" can be used. The deep trench isolation region 214+216 can be used for purposes that are similar to the above-described purposes for which the guard ring 120'+112'+128'+129" can be used.

Figure 3:
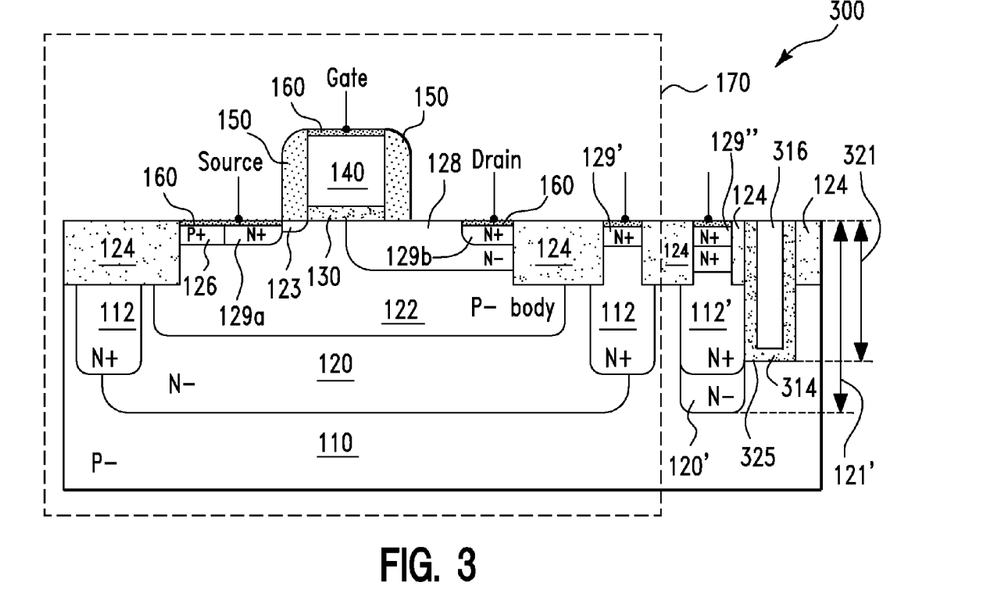
FIGS. 3 through 6 show a cross-section view of third through sixth semiconductor structure, in accordance with embodiments of the present invention.

FIG. 3 shows a cross-section view of a semiconductor structure 300, in accordance with embodiments of the present invention. More specifically, the structure 300 is similar to the structure 100 of FIG. 1G except that the structure 300 further comprises a trench isolation region 314+316. The trench isolation region 314+316 comprises a dielectric region 314 surrounding a poly-silicon region 316. The formation of the structure 300 of FIG. 3 is similar to the formation of the structure 100 of FIG. 1G except that the formation of the structure 300 further comprises the formation of the trench isolation region 314+316 which can be performed by a conventional method. The trench isolation region 314+316 can be formed immediately after forming the STI regions 124. It should be noted that the guard ring 120'+112'+128'+129" is formed using steps in the fabrication process of the LDMOS transistor 170. In one embodiment, a depth 321 of the trench isolation region 314+316 is less than the depth 121' of the N− region 120' (i.e., the depth of the guard ring 120'+112'+128'+ 129"). The depth 321 of the trench isolation region 314+316 is a vertical distance from the top surface 111 of the substrate 110 to the bottom surface 325 of the trench isolation region 314+316.

Figure 4:
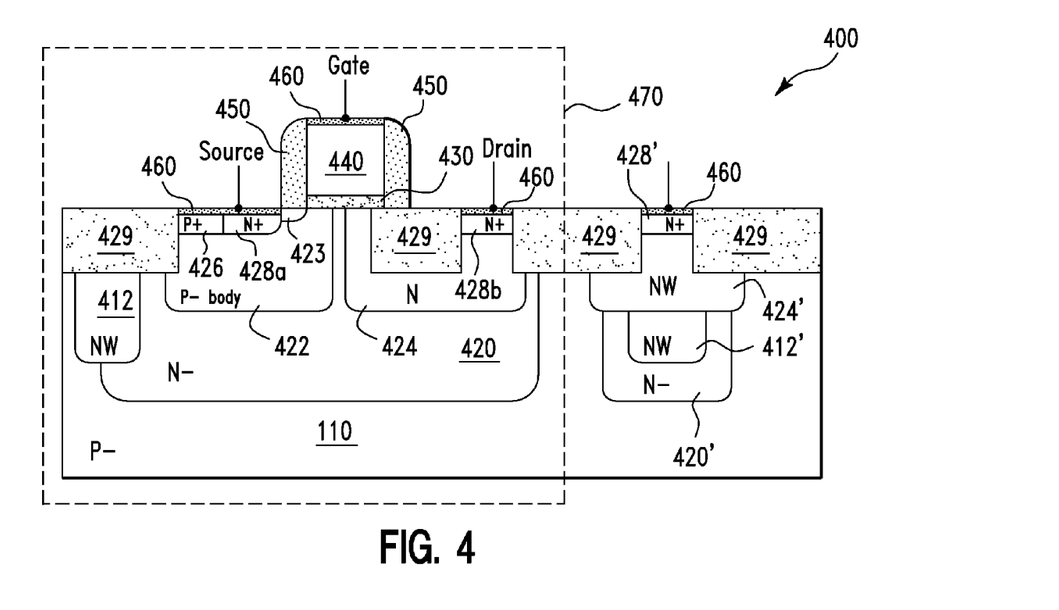

FIG. 4 shows a cross-section view of a semiconductor structure 400, in accordance with embodiments of the present invention. More specifically, the semiconductor structure 400 comprises a LDMOS transistor 470 and a guard ring 420'+ 412'+424'+428'. The guard ring 420'+412'+424'+428' comprises an N− region 420', an N-well region 412', an N-well region 424', and an N+ region 428'.

In one embodiment, the LDMOS transistor 470 is formed by a conventional method. In one embodiment, the guard ring 420'+412'+424'+428' is formed using steps in the fabrication process of the LDMOS transistor 470. More specifically, the formation of the N− region 420' is performed simultaneously with the formation of the N− region 420. The formation of the N-well region 412' is performed simultaneously with the formation of the N-well region 412. The formation of the N-well region 424' is performed simultaneously with the formation of the N-well region 424. The formation of the N+ region 428' is performed simultaneously with the formation of the N+ region 428.

Figure 5:
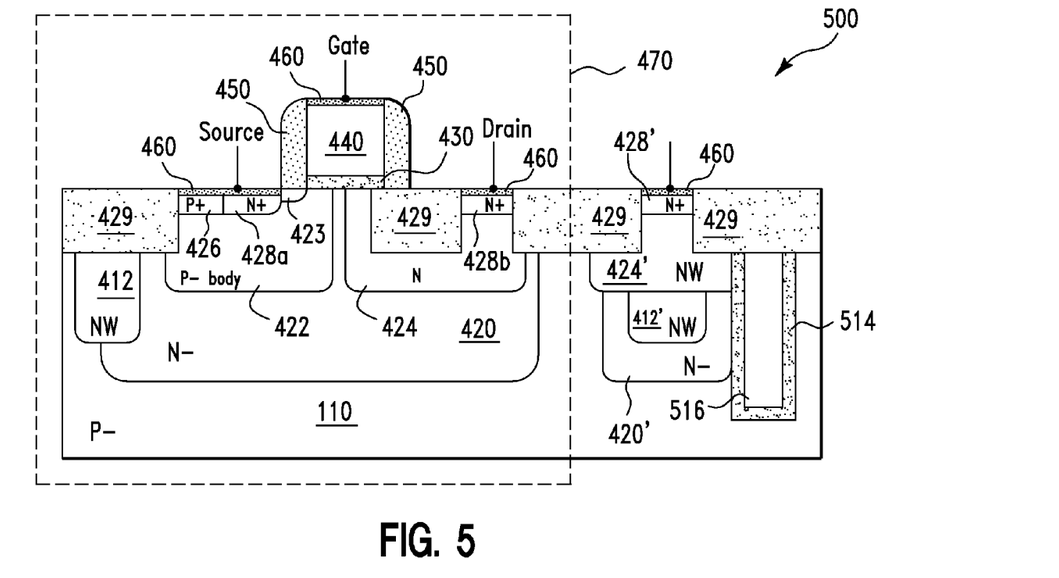

FIG. 5 shows a cross-section view of a semiconductor structure 500, in accordance with embodiments of the present invention. More specifically, the structure 500 is similar to the structure 400 of FIG. 4 except that the structure 500 further comprises a deep trench isolation region 514+516. The deep trench isolation region 514+516 comprises a dielectric region 514 surrounding a poly-silicon region 516. The formation of the structure 500 of FIG. 5 is similar to the formation of the structure 100 of FIG. 4 except that the formation of the structure 500 further comprises the formation of the deep trench isolation region 514+516 which can be performed by a conventional method. The deep trench isolation region 514+516 is formed first and then the LDMOS transistor 470 and the guard ring 420'+412'+424'+428' are formed. In one embodiment, the guard ring 420'+412'+424'+428' is formed using steps in the fabrication process of the LDMOS transistor 470.

Figure 6:
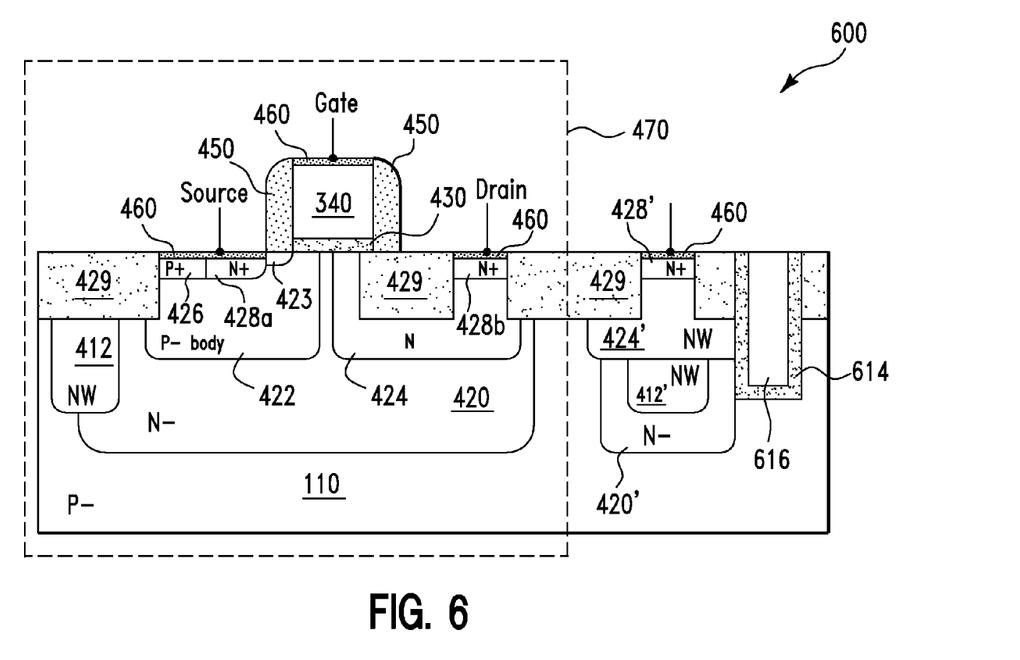

FIG. 6 shows a cross-section view of a semiconductor structure 600, in accordance with embodiments of the present invention. More specifically, the structure 600 is similar to the structure 400 of FIG. 4 except that the structure 600 further comprises a trench isolation region 614+616. The trench isolation region 614+616 comprises a dielectric region 614 surrounding a poly-silicon region 616. The formation of the structure 600 of FIG. 6 is similar to the formation of the structure 400 of FIG. 4 except that the formation of the structure 600 further comprises a formation of the trench isolation region 614+616 which can be performed by a conventional method. The trench isolation region 614+616 can be formed immediately after forming the STI regions 429. In one embodiment, the guard ring 420'+412'+424'+428' is formed using steps in the fabrication process of the LDMOS transistor 470.

In summary, in the fabrication processes for forming the LDMOS transistors 170 of FIGS. 1G, 2C, and 3, the guard rings 120'+112'+128'+129" are formed simultaneously using steps in the fabrication processes of the LDMOS transistors 170. In the fabrication processes for forming the LDMOS transistors 470 of FIGS. 4-6, the guard rings 420'+412'+424'+428' are formed simultaneously using steps in the fabrication processes of the LDMOS transistors 470. Deep trench isolation regions and trench isolation regions are also formed in the semiconductor structures of FIGS. 2C, 3, 5, and 6. The deep trench isolation regions and the trench isolation regions either (i) form a closed loop around the LDMOS transistors 170 and 470 or (ii) form a closed loop around a chip (i.e., is on a perimeter of the chip), wherein the chip includes the LDMOS transistors 170 and 470 and other LDMOS transistors.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. The semiconductor structure, comprising:
 a semiconductor substrate which includes a top substrate surface which defines a reference direction perpendicular to the top substrate surface;
 a first transistor on the semiconductor substrate;
 a guard ring on the semiconductor substrate,
  wherein the guard ring comprises a semiconductor material doped with a doping polarity,
  wherein a first doping profile of a first doped transistor region of the first transistor in the reference direction and a second doping profile of a first doped guard-ring region of the guard ring in the reference direction are essentially a same doping profile, and
  wherein the guard ring forms a closed loop around the first transistor; and a deep trench isolation region,
  wherein the deep trench isolation region has a third depth in the reference direction,
  wherein the guard ring has a second depth in the reference direction,
  wherein the third depth is greater than the second depth,
  wherein the deep trench isolation region is in direct physical contact with the guard ring, and
  wherein the deep trench isolation region forms a closed loop around the first transistor.

2. The semiconductor structure of claim 1, further comprising a plurality of transistors on the semiconductor substrate,
 wherein the first transistor and the plurality of transistors are electrically coupled together resulting in a semiconductor integrated circuit, and
 wherein the guard ring forms a closed loop around the first transistor and the plurality of transistors.

3. The semiconductor structure of claim 1,
 wherein the first transistor has a first depth in the reference direction, and
 wherein the first depth is essentially equal to the second depth.

4. A semiconductor structure, comprising:
 a semiconductor substrate which includes a top substrate surface which defines a reference direction perpendicular to the top substrate surface;
 a first transistor on the semiconductor substrate;
 a guard ring on the semiconductor substrate,
  wherein the guard ring comprises a semiconductor material doped with a doping polarity,
  wherein a first doping profile of a first doped transistor region of the first transistor in the reference direction and a second doping profile of a first doped guard-ring region of the guard ring in the reference direction are essentially a same doping profile, and
  wherein the guard ring forms a closed loop around the first transistor; and a trench isolation region,
  wherein the trench isolation region has a fourth depth in the reference direction,
  wherein the guard ring has a second depth in the reference direction,
  wherein the fourth depth is less than the second depth,
  wherein the trench isolation region is in direct physical contact with the guard ring, and
  wherein the trench isolation region forms a closed loop around the first transistor.

5. The semiconductor structure of claim 1, further comprising a second transistor on the semiconductor substrate,
 wherein the second transistor is outside the closed loop formed by the guard ring, and
 wherein the first and second transistors are LDMOS transistors.

6. The semiconductor structure of claim 1, further comprising a second transistor on the semiconductor substrate,
 wherein the second transistor is outside the closed loop formed by the guard ring,
 wherein the first transistor is configured to operate at 45V, and
 wherein the second transistor is configured to operate at 5V.

7. The semiconductor structure of claim 1, further comprising a second transistor on the semiconductor substrate,
 wherein the second transistor is outside the closed loop formed by the guard ring,
 wherein the first transistor is configured to operate at a first voltage level, and
 wherein the second transistor is configured to operate at a second voltage level different than the first voltage level, and
 wherein the first and second voltage levels each are not higher than 5V.

8. The semiconductor structure of claim 4, further comprising a plurality of transistors on the semiconductor substrate,
   wherein the first transistor and the plurality of transistor are electrically coupled together resulting in a semiconductor integrated circuit, and
   wherein the guard ring forms a closed loop around the first transistor and the plurality of transistors.

9. The semiconductor structure of claim 4,
   wherein the first transistor has a first depth in the reference direction, and
   wherein the first depth is essentially equal to the second depth.

10. The semiconductor structure of claim 4, further comprising a second transistor on the semiconductor substrate,
    wherein the second transistor is outside the closed loop formed by the guard ring, and
    wherein the first and second transistors are LDMOS transistors.

11. The semiconductor structure of claim 4, further comprising a second transistor on the semiconductor substrate,
    wherein the second transistor is outside the closed loop formed by the guard ring,
    wherein the first transistor is configured to operate at 45V, and
    wherein the second transistor is configured to operate at 5V.

12. The semiconductor structure of claim 4, further comprising a second transistor on the semiconductor substrate,
    wherein the second transistor is outside the closed loop formed by the guard ring,
    wherein the first transistor is configured to operate at a first voltage level, and
    wherein the second transistor is configured to operate at a second voltage level different than the first voltage level, and
    wherein the first and second voltage levels each are not higher than 5V.

* * * * *